(12) United States Patent
Havens

(10) Patent No.: US 7,109,708 B2
(45) Date of Patent: Sep. 19, 2006

(54) SYSTEMS, METHODS AND APPARATUS OF A MAGNETIC RESONANCE IMAGING MAGNET TO PRODUCE AN ASYMMETRICAL STRAY FIELD

(75) Inventor: Timothy John Havens, Florence, SC (US)

(73) Assignee: General Electric Company, Schenectady, NY (US)

( * ) Notice: Subject to any disclaimer, the term of this patent is extended or adjusted under 35 U.S.C. 154(b) by 104 days.

(21) Appl. No.: 10/922,499

(22) Filed: Aug. 19, 2004

(65) Prior Publication Data

US 2006/0038565 A1 Feb. 23, 2006

(51) Int. Cl.
*G01V 3/00* (2006.01)
(52) U.S. Cl. .................................................. 324/307
(58) Field of Classification Search .................. None
See application file for complete search history.

(56) References Cited

U.S. PATENT DOCUMENTS

| | | | |
|---|---|---|---|
| 4,682,134 A | | 7/1987 | Laskaris |
| 5,250,901 A | * | 10/1993 | Kaufman et al. ............ 324/318 |
| 5,304,934 A | | 4/1994 | Laskaris et al. |
| 5,307,039 A | | 4/1994 | Chari et al. |
| 5,343,148 A | * | 8/1994 | Westphal et al. ............ 324/309 |
| 5,416,415 A | | 5/1995 | Dorri et al. |
| 5,646,532 A | * | 7/1997 | Knuttel et al. ............... 324/321 |
| 6,064,290 A | * | 5/2000 | Xu et al. ..................... 335/296 |
| 6,140,900 A | | 10/2000 | Crozier et al. |
| 6,255,929 B1 | * | 7/2001 | Xu et al. ..................... 335/299 |
| 6,538,545 B1 | * | 3/2003 | Wakuda et al. .............. 335/296 |
| 2003/0011455 A1 | * | 1/2003 | Wakuda et al. .............. 335/299 |
| 2006/0077025 A1 | * | 4/2006 | Funaki et al. ................ 335/216 |

FOREIGN PATENT DOCUMENTS

| | | |
|---|---|---|
| EP | 1 074 852 A2 | 7/2001 |
| JP | 401253214 A * | 10/1989 |
| WO | WO 2004/097443 A1 | 11/2004 |

OTHER PUBLICATIONS

Forbes & Crozier, Novel Target-Field Method for designing Shielded Biplanar Shim and Gradient Coils, IEEE:Transactions on Magnetics, Jul. 2004, pp. 1929-1938,vol. 40,No. 4, US.
Brideson et al., Winding Patterns for Actively Shielded Coils with Asymmetric target-Fields,Measurement Science and Technology,2003,pp. 484-493,vol. 14, UK.

* cited by examiner

*Primary Examiner*—Diego Gutierrez
*Assistant Examiner*—Dixomara Vargas
(74) *Attorney, Agent, or Firm*—Carl Horton; Pete Vogel; Michael Smith

(57) ABSTRACT

Systems, methods and apparatus are provided through which in some embodiments a magnetic resonance imaging (MRI) system includes an asymmetrical magnet to generate an asymmetrical stray field that is particularly well suited to imaging limbs. In some other embodiments, a MRI system includes a conically-shaped casing that allows a patient to more readily access a field-of-view (FOV) in the interior of the MRI system during imaging of limbs. In some embodiments, a MRI system includes a stepped inner bore that has a stepped shape that focuses the FOV in an inner bore of the MRI system on a smaller area that is closer to where a patient accesses the FOV in the MRI that is particularly well suited to imaging a limb in the FOV.

20 Claims, 13 Drawing Sheets

FIG. 6

SYSTEMS, METHODS AND APPARATUS OF A MAGNETIC RESONANCE IMAGING MAGNET TO PRODUCE AN ASYMMETRICAL STRAY FIELD

FIELD OF THE INVENTION

This invention relates generally to magnetic resonance imaging systems, and more particularly to magnetic resonance imaging systems for orthopedic anatomic extremity imaging.

BACKGROUND OF THE INVENTION

Orthopedics is a medical specialty concerned with correction of deformities or functional impairments of the skeletal system, particularly, of the extremities and the spine, and associated structures, such as muscles and ligaments. For example, diagnosis and treatment of broken hand bones is a common practice in orthopedics. Because many orthopedic health problems are subcutaneous, imaging anatomy under the skin is a very important capability in orthopedics. Magnetic resonance imaging (MRI) is one imaging technique implemented in orthopedic diagnosis.

Conventional MRI systems do not accommodate many of the unique requirements of imaging of extremities such as hands, elbows and knees. More specifically, conventional MRI systems have shapes and sizes that do not easily accommodate the imaging of a hand, a wrist, an elbow, an ankle or a knee. In particular, the shapes and sizes of conventional MRI systems are designed to accommodate much larger objects, such as an entire adult human body.

Access is rather difficult to the area in the MRI system where the imaging occurs because of the large dimensions of a conventional MRI system. The patient is often required to assume uncomfortable positions during the imaging, the duration of which can be twenty minutes. Even in a smaller, conventionally shaped orthopedic MRI system with active shielding, the front face of the MRI system is fairly large. In order to place a knee into the bore in the imaging area, known as the field of view, the patient's other leg must be either put in a downward position, a slightly backward position, or a position off to one side. The positions are often uncomfortable and aggravating for patients with minor health problems, and often difficult and/or painful for seriously injured patients, and in some instances, either physically impossible or physically harmful.

More specifically, the problem with the size and shape of conventionally shaped orthopedic MRI systems is that the front face of the MRI system is wide. A patient with a leg placed in the MRI bore has no room or space forward in the direction of the MRI in which to place their other leg because the width of the MRI system occupies that space. Another problem with the size and shape of conventional MRI systems is that the distance between the front face and the field of view is minimally sufficient, if at all sufficient, to allow the patient to extend their arm into the field of view from the outside of the MRI system. Hence, in conventional full-size MRI systems, patients must egress into the center of the MRI even for orthopedic imaging of limbs. For claustrophobic patients, this can be a traumatic experience.

In addition, the large size of conventional MRI systems requires a large floor space to in which to site the MRI system. The large floor space is one aspect of conventional MRI systems that is not welcomed by medical facilities because of the high cost of each square foot of floor space.

In addition, access to fields above 5 gauss must be controlled, which requires hospital floor space. The symmetrical shape of the large stray field of conventional MRI systems requires a large floor space behind the magnet to site the MRI system. The large floor space is one aspect of conventional MRI systems that is not welcomed by medical facilities because of the high cost of each square foot of floor space.

For the reasons stated above, and for other reasons stated below which will become apparent to those skilled in the art upon reading and understanding the present specification, there is a need in the art for an MRI system with a size and shape that provides more comfortable access to a patient during imaging of an extremity of the patient. There is also a need for reduced floor space requirements of MRI systems.

BRIEF DESCRIPTION OF THE INVENTION

The above-mentioned shortcomings, disadvantages and problems are addressed herein, which will be understood by reading and studying the following specification.

In one aspect, an apparatus to image a subject comprises a casing and at least one asymmetrical magnet disposed in the casing. The asymmetrical magnet provides an asymmetrical stray field that projects one portion of the stray field further towards a position where a patient access the imaging inner bore of the MRI, thereby solving the need in the art for an MRI system with that provides more comfortable access to a patient during imaging of an extremity of the patient while reducing hospital floor space requirements. In some further embodiments, an asymmetrically-shaped array of a plurality of magnetic coils further comprises an elongated shape in which an elongated portion of the elongated shape is furthest from where a patient would be located during operation of the magnetic resonance imaging apparatus, further reducing floor space requirements.

In another aspect, an apparatus to image a subject comprises a casing having a conically-shaped outer perimeter, the casing having an inner bore, and a plurality of magnetic coils positioned in the casing in close proximity to the inner bore. A narrow portion of the conically shaped outer perimeter is closer towards a position where a patient access the imaging inner bore of the MRI, thereby solving the need in the art for an MRI system with that provides more comfortable access to a patient during imaging of an extremity of the patient. The conical shape also provides a smaller volume of the casing, which solves the need in the art for reduced floor space requirements of MRI systems.

In yet another aspect, an apparatus to image a subject using magnetic resonance comprises a casing having an inner bore, the inner bore defining an inner diameter of the casing, wherein the inner diameter further comprises a stepped radius in which a wider portion of the inner diameter includes a gradient coil and the wider portion is furthest from where a patient would access the inner bore during operation of the magnetic resonance imaging apparatus. The stepped inner diameter provides an apparatus that supports insertion of a gradient coil from one end of magnet, while improving the length of a superconductor and the stray field.

Apparatus, systems, and methods of varying scope are described herein. In addition to the aspects and advantages described in this summary, further aspects and advantages will become apparent by reference to the drawings and by reading the detailed description that follows.

DETAILED DESCRIPTION OF THE INVENTION

In the following detailed description, reference is made to the accompanying drawings that form a part hereof, and in which is shown by way of illustration specific embodiments which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The detailed description is divided into five sections. In the first section, a system level overview is described. In the second section, apparatus of embodiments are described. In the third section, methods of embodiments are described. In the fourth section, the hardware and the operating environment in conjunction with which embodiments may be practiced are described. Finally, in the fifth section, a conclusion of the detailed description is provided.

System Level Overview

Figure 1:
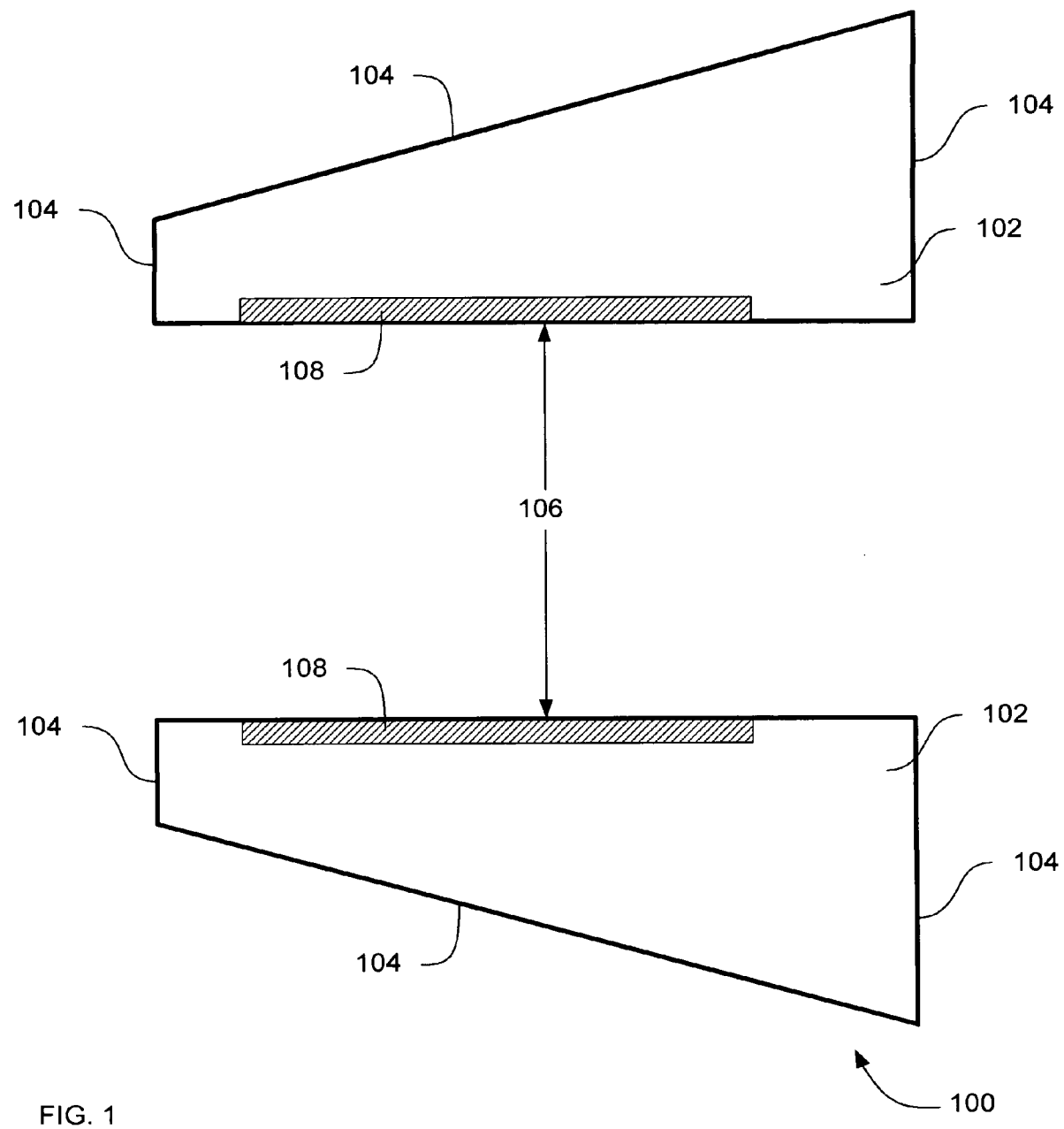
FIG. 1 is a side view cross-sectional block diagram that provides a system level overview of an apparatus having a conical outer perimeter to image a subject using magnetic resonance.

FIG. 1 is a side view cross-sectional block diagram that provides a system level overview of a system having a conical outer perimeter to image a subject using magnetic resonance. System 100 solves the need in the art for more comfortable access to an MRI system by a patient during imaging of an extremity of the patient. System 100 also solves the need in the art for reduced floor space requirements of MRI systems.

System 100 includes a casing 102 having a conically-shaped outer perimeter 104. The conically-shaped outer perimeter 104 of the casing 102 provides a small outer diameter of the casing 102 at an end of the system 100 that is closest to the patient. The small outer diameter improves patient comfort while a knee of the patient is placed in the system 100 for imaging of the knee. The small outer diameter allows a patient to more readily access a field-of-view (FOV) in the interior of the MRI system during imaging of limbs for orthopedic diagnosis because most adult patients are able to place their other leg to the side of the system. Thus, system 100 solves the need in the art for more comfortable access to a MRI system by a patient during imaging of an extremity of the patient.

In addition, the small outer diameter of the casing 102 at an end of system 100 that is closest to the patient yields a casing 102 that has a reduced volume in the casing 102 that in turn solves the need in the art for reduced floor space requirements of MRI systems. Furthermore, the smaller size does not require egress into the center of the entire system for orthopedic medical imaging, which more readily accommodates claustrophobic patients.

System 100 also includes an inner bore 106 of the casing 102. A plurality of magnetic main coils 108 are positioned in the casing 102 in close proximity to the inner bore 104.

The system level overview of the operation of an embodiment has been described in this section of the detailed description. System 100 includes a conically-shaped casing outer perimeter 104 improves patient comfort during imaging of a knee of the patient, which in turn provides more comfortable access to a MRI system during imaging.

Apparatus 400 below is one embodiment of system 100 having a conically angled outer perimeter. While the system 100 is not limited to any particular casing 102, conically-shaped outer perimeter 104, inner bore 106, or magnetic main coils 108, for sake of clarity a simplified casing 102, conically-shaped outer perimeter 104, inner bore 106, magnetic main coils 108 have been described.

Figure 2:
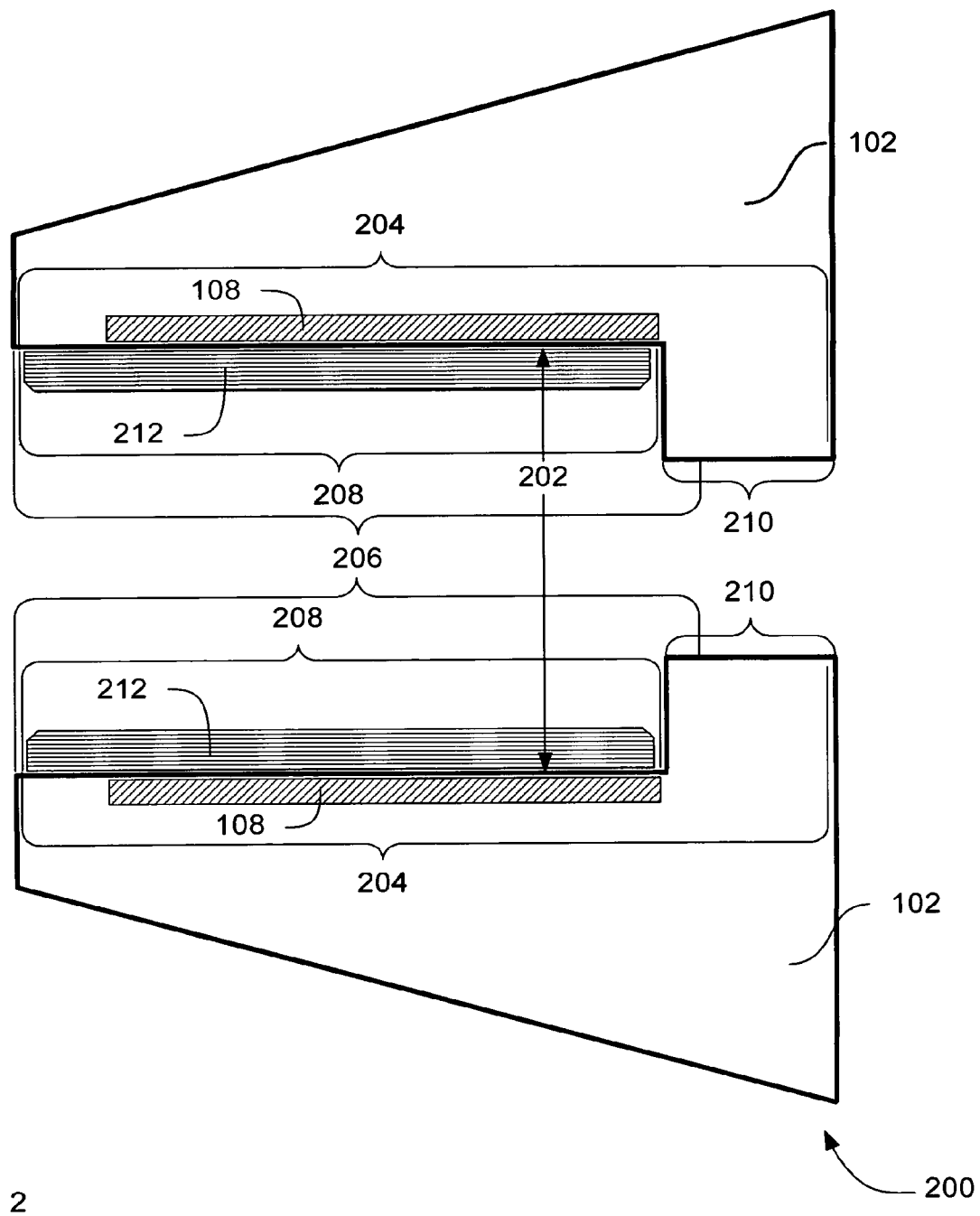
FIG. 2 is a side view cross-sectional block diagram that provides a system level overview of an apparatus having a stepped inner diameter to image a subject using magnetic resonance.

FIG. 2 is a side view cross-sectional block diagram that provides a system level overview of an apparatus having a stepped inner diameter to image a subject using magnetic resonance. System 200 solves the need in the art for more comfortable access to an MRI system by a patient during imaging of an extremity of the patient.

System 200 includes a casing 102 having an inner bore 202. The inner bore 106 defines an inner diameter 204 of the casing. The inner diameter 204 further comprises a stepped radius 206.

A first portion 208 of the stepped radius 206 of the inner diameter 204 of the inner bore 202 is closer to where a patient enters the system than a second portion 210. The first portion 208 also includes a gradient coil 212. The smaller inner diameter 204 allows a small magnet and less or reduced shielding on the end of the system where the inner diameter is located.

The stepped radius provides a stray field of the magnet 108 that is contained close to the magnet 108. The close stray field provides a system 200 that is more compact in its dimensions, that in turn solves the need in the art for reduced floor space requirements of MRI systems. The compact dimensions of system 200 improve patient comfort while a leg or arm of the patient is placed in the system for imaging. Thus, system 200 solves the need in the art for more comfortable access to a MRI system by a patient during imaging of an extremity of the patient.

System 200 also includes a plurality of magnetic main coils 108 are positioned in the casing 102 in close proximity to the stepped radius 206 of the inner bore 202.

The system level overview of the operation of an embodiment has been described in this section of the detailed description. System 200 includes a stepped radius 206 of the inner bore 202 provides space for a gradient coil while allowing minimal stray field at end furthest from the patient for minimal hospital space requirements.

While the system 200 is not limited to any particular casing 102, magnet 108, inner bore 202, inner diameter 204, and stepped radius 206, for sake of clarity a simplified casing 102, magnet 108, inner bore 202, inner diameter 204, and stepped radius 206 have been described.

Figure 3:
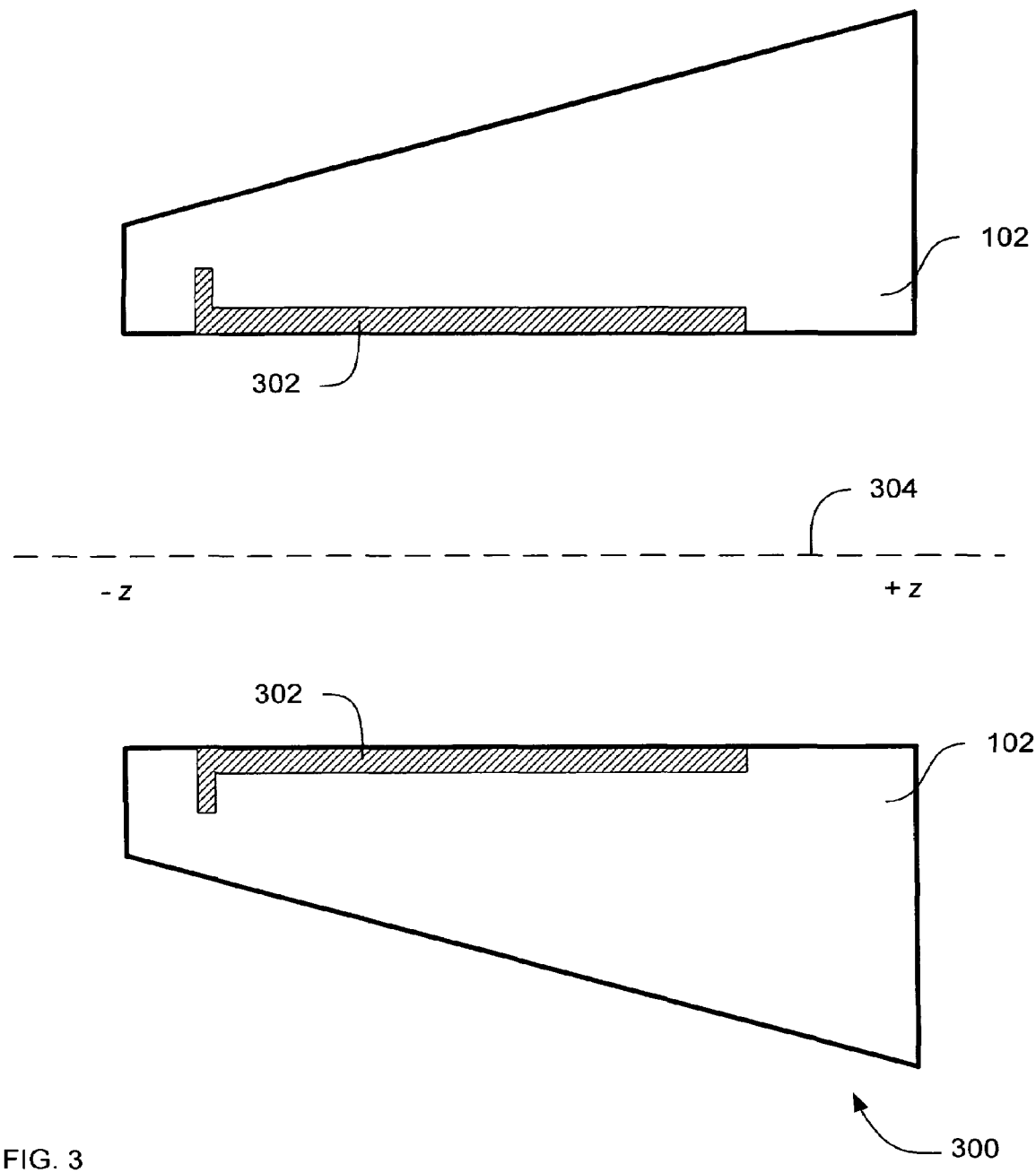
FIG. 3 is a side view cross-sectional block diagram that provides a system level overview of an apparatus having an asymmetrical magnet to image a subject.

FIG. 3 is a side view cross-sectional block diagram that provides a system level overview of an apparatus having an asymmetrical magnet to image a subject. System 300 solves the need in the art for more comfortable access to an MRI system by a patient during imaging of an extremity of the patient.

System 300 includes a casing 102 and at least one asymmetric magnet 302 disposed in the casing 102. The asymmetric magnet 302 generates an asymmetric stray field that extends further along the negative portion of a longitudinal Z axis 304 than along the positive portion of the longitudinal Z axis. The asymmetric magnet 302 with a stray field having an increased length at the end closest to the patient maintains imaging volume, also known as a field-of-view (FOV) close to the patient for optimal access for elbow and knee imaging, while requiring minimal hospital floor space. Thus, system 300 solves the need in the art for more comfortable access to a MRI system by a patient during imaging of an extremity of the patient.

The system level overview of the operation of an embodiment has been described in this section of the detailed description. While the system 300 is not limited to any particular casing 102 or asymmetric magnet 302, for sake of clarity a simplified casing 102 and asymmetric magnet 302 has been described.

Apparatus of an Embodiment

In the previous section, a system level overview of the operation of an embodiment was described. In this section, the particular apparatus of such an embodiment are described by reference to a series of diagrams.

Figure 4:
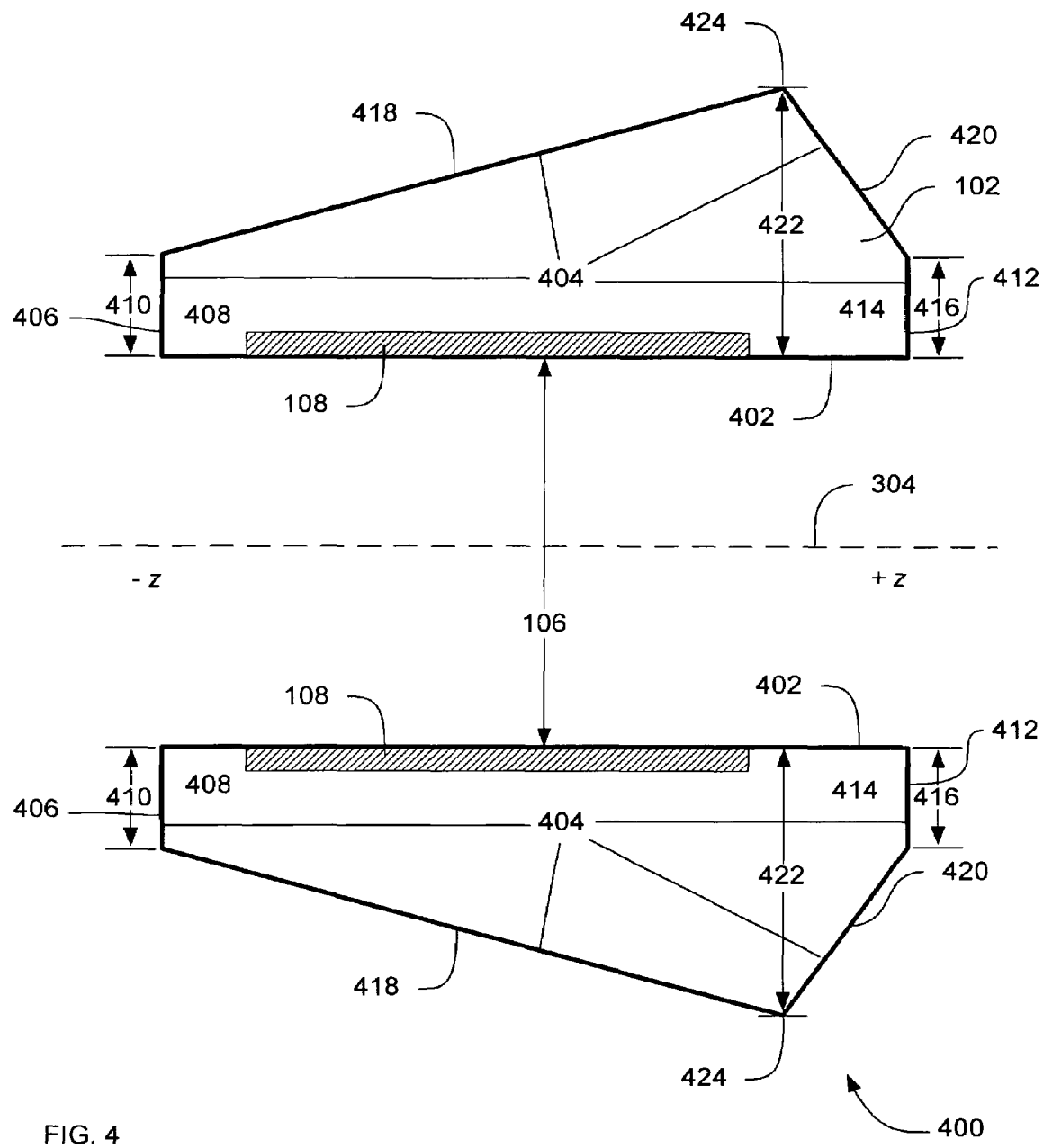
FIG. 4 is a side view cross-sectional block diagram of an apparatus having a conically angled outer perimeter to image a subject using magnetic resonance.

FIG. 4 is a side view cross-sectional block diagram of an apparatus having a conically angled outer perimeter to image a subject using magnetic resonance. System 400 solves the need in the art for more comfortable access to an MRI system by a patient during imaging of an extremity of the patient. System 400 also solves the need in the art for reduced floor space requirements of MRI systems. Apparatus 400 is one embodiment of system 100.

In apparatus 400, the inner bore 106 defines a longitudinal axis 304 that runs through the center of the inner bore 106. The inner bore 106 defines an inner diameter 402 of the casing 102. In some embodiments of apparatus 400, the inner diameter 402 further comprises a radial distance of about seventeen centimeters A conically angled outer perimeter 404 is further defined by a casing 102 that comprises a front face 406 at a first end 408 of the inner bore 106. In some embodiments, the front face 406 is approximately or about perpendicular to the longitudinal axis 304. The front face 406 has a front radial distance 410 from the inner diameter 402 of the casing 102.

In some embodiments, the conically angled outer perimeter 404 further includes a back face 412 at a second end 414 of the inner bore 106. The back face 412 is about perpendicular to the longitudinal axis 304. The back face 412 has a back radial distance 416 from the inner diameter 402.

The conically angled outer perimeter 404 further comprises a first middle face 418 joining the front face 406. A second middle face 420 joins the first middle face 418 and the back face 412. The first middle face 418 and the second middle face 420 have a middle radial distance 422 from the inner diameter 402 to the joint 424 between the first middle face 418 and the second middle face 420.

The middle radial distance 422 further comprises a greater distance than the front radial distance 410 which provides the conical shape to the casing 102.

In some embodiments of apparatus 400, the front radial distance 410 is about equal to the back radial distance 416, such as about twenty-five centimeters. In some embodiments of apparatus 400, the back radial distance 416 is about equal to the middle radial distance 422, such as about 40 centimeters.

Figure 5:
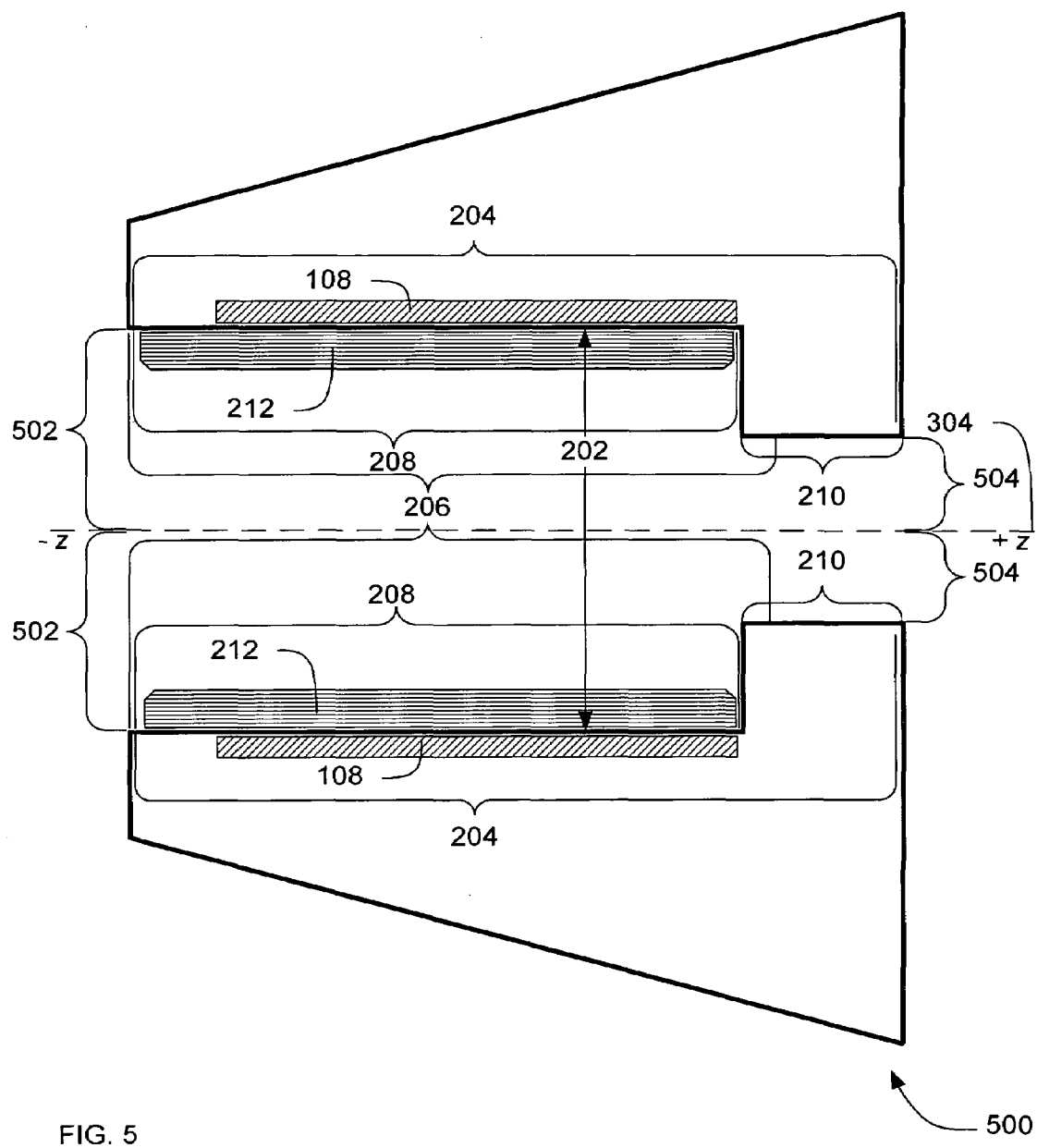
FIG. 5 is a side view cross-sectional block diagram of an apparatus having an embodiment of a bi-stepped inner diameter to image a subject using magnetic resonance.

FIG. 5 is a side view cross-sectional block diagram of an apparatus having an embodiment of a bi-stepped inner diameter to image a subject using magnetic resonance. System 500 solves the need in the art for more comfortable access to an MRI system by a patient during imaging of an extremity of the patient.

The stepped radius 206 of the inner diameter 204 of the inner bore 202 of system 500 comprises a first portion 208 of the inner bore 202. The first portion has a first radius 502. In some embodiments, the first radius 502 has a radial distance of about seventeen centimeters around the longitudinal axis 304. In some embodiments, the first radius 502 is about 45 centimeters.

The stepped radius 206 further comprises a second portion 210 of the inner bore 202. The second portion 210 has a second radius 504 that is unequal to the first radius 502. In some embodiments, the second radius 504 has a radial distance of about twelve centimeters around the longitudinal axis 304. In some embodiments, the second radius 504 is about 32.5 centimeters.

The bi-stepped radius provides a stray field of the magnet 108 that is contained close to the magnet 108. The close stray field provides a system 500 that is more compact in its dimensions, that in turn solves the need in the art for reduced floor space requirements of MRI systems. The compact dimensions of system 500 improve patient comfort while a leg or arm of the patient is placed in the system for imaging. Thus, system 500 solves the need in the art for more comfortable access to a MRI system by a patient during imaging of an extremity of the patient.

Figure 6:
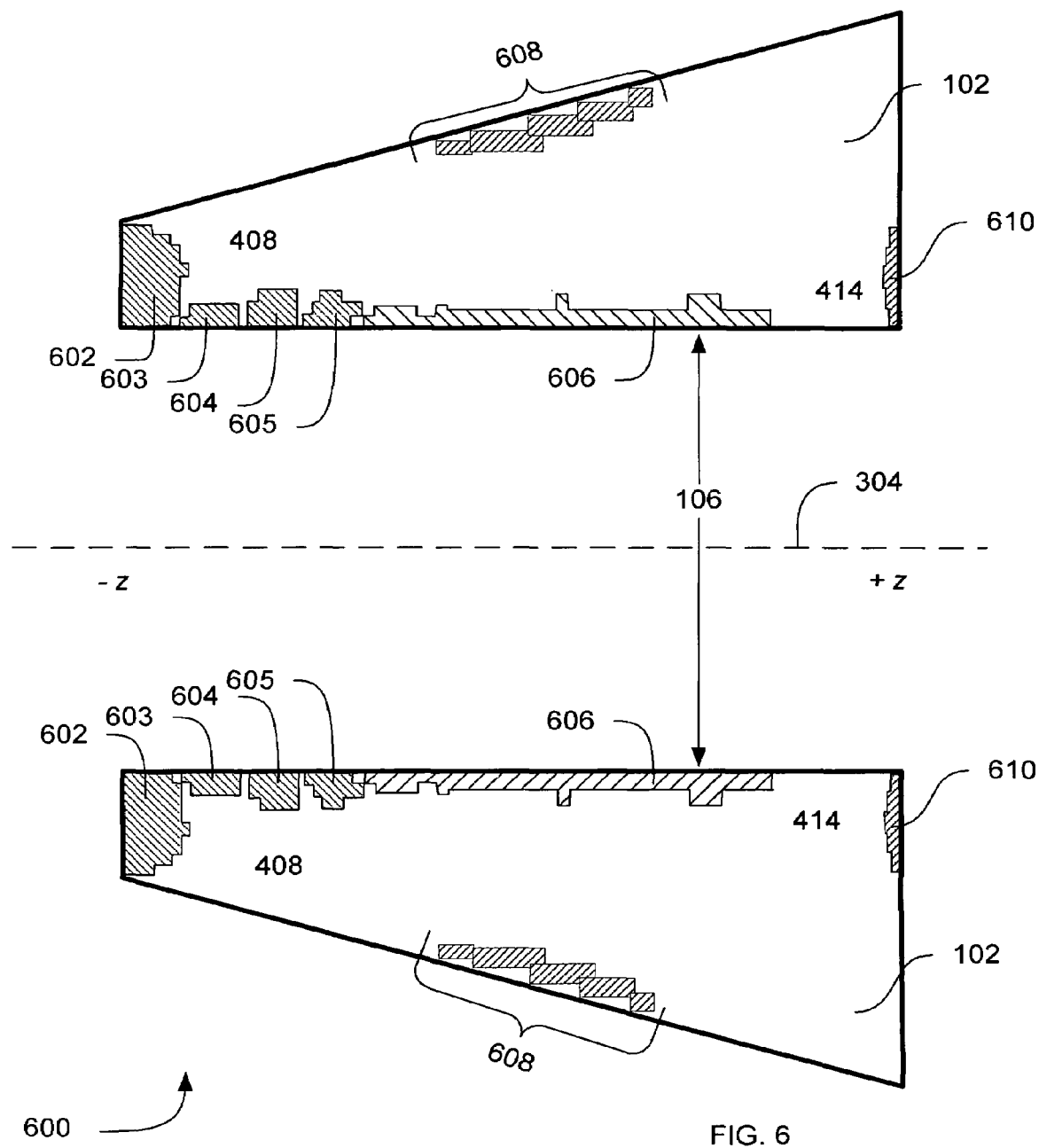
FIG. 6 is a side view cross-sectional block diagram an apparatus having an asymmetric magnet to image a subject.

FIG. 6 is a side view cross-sectional block diagram an apparatus having an asymmetric magnet to image a subject. System 600 solves the need in the art for more comfortable access to an MRI system by a patient during imaging of an extremity of the patient.

System 600 includes a casing 102 and at least one asymmetric magnet disposed in the casing 102. The magnet comprises one or more coils operable to generate a magnetic field upon electrification. System 600 includes coils 602, 603, 604, 605 and 606. The one or more coils are positioned asymmetrically in the casing in close proximity to the inner bore 106. In some embodiments, the asymmetrically-shaped array of the plurality of magnetic coils further comprises an elongated shape in which an elongated portion of the elongated shape is furthest from where a patient would be located during operation of the magnetic resonance imaging apparatus. The position of the coils is also known as a configuration, an arrangement and/or an array.

The electromagnetic field of the coils is formed into an asymmetric stray field by an asymmetric position of electromagnetic shields 608 and 610. In particular, shielding 610 retains the stray field close to the second end 414. Yet the first end 408 has less, reduced, or no, shielding. The shielding 610 on the second end 414 and the reduced shielding on the first end 408 yields a stray field that is skewed or elongated in the direction of the first end 408—in the direction of where a patient would be located during operation of the magnetic resonance imaging apparatus. The asymmetric stray field extends further along the negative portion of a longitudinal Z axis 304 than along the positive portion of the longitudinal Z axis 304. This provides a field-of-view (FOV) that is closer to the patient, allowing a patient to more easily place a limb in the FOV for imaging. Thus, system 600 solves the need in the art for more comfortable access to an MRI system by a patient during imaging of an extremity of the patient. This also provides a system with reduced space requirements at the hospital site, with an envelope containing the 5 gauss asymmetric stray field shown in FIG. 8.

In some embodiments, apparatus 600 has a length along the longitudinal Z axis 304 of about 55 centimeters. The 5 gauss line of the stray field extends about 3.0 meters in the negative direction of the longitudinal Z axis 304, about 1.0 meters in the positive direction of the longitudinal Z axis 304, and about 2.1 meters in either direction from the Z axis along the R axis, or the radial direction.

While the apparatus 600 is not limited to any particular coil 602, 603, 604, 605, and/or 606 shields 608 and 610. For sake of clarity, simplified coils 602, 603, 604, 605 and/or 606 shields 608 and 610 have been described.

Figure 7:
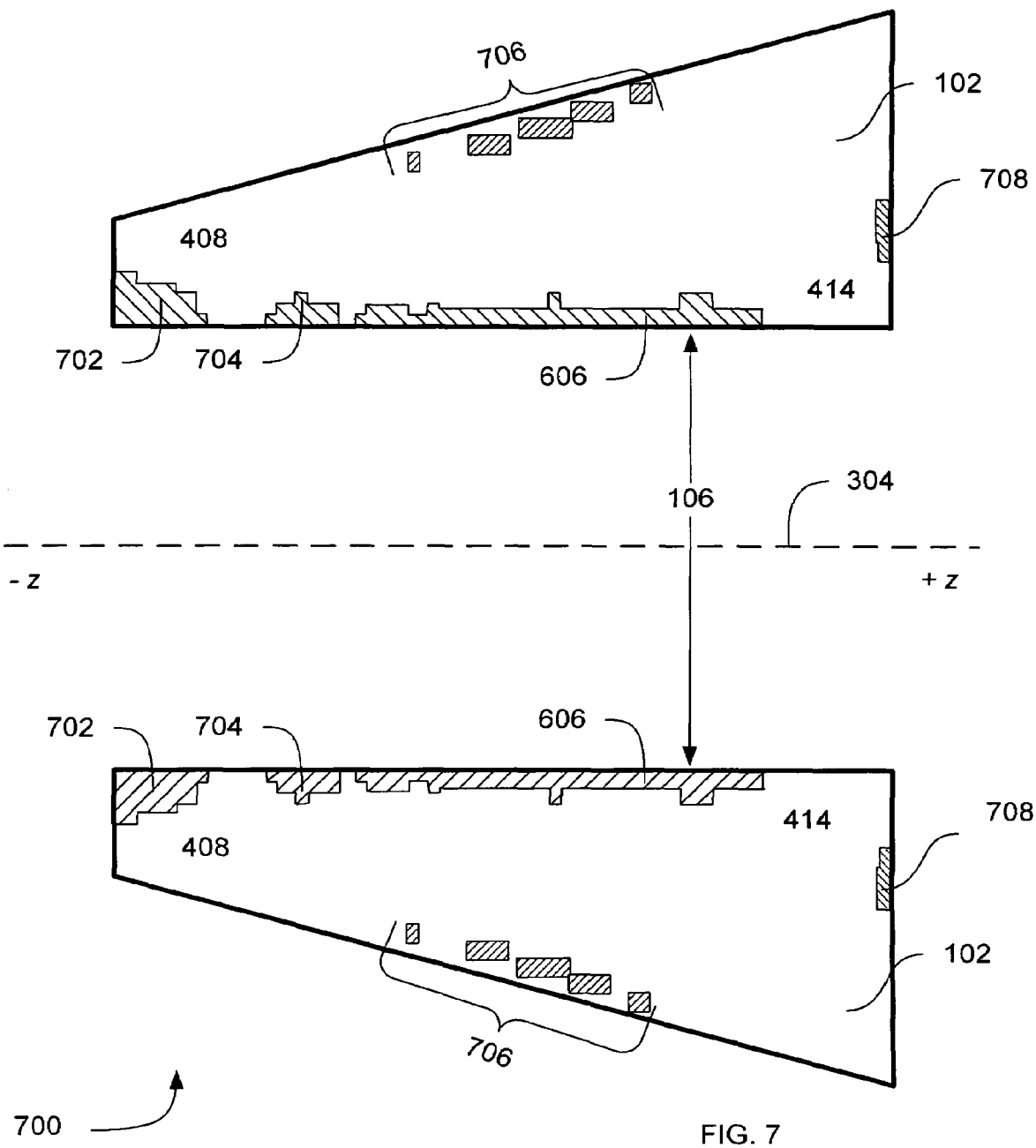
FIG. 7 is a side view cross-sectional block diagram an apparatus having an asymmetric magnet to image a subject.

FIG. 7 is a side view cross-sectional block diagram an apparatus having an asymmetric magnet to image a subject. System 700 solves the need in the art for more comfortable access to an MRI system by a patient during imaging of an extremity of the patient.

System 700 includes a casing 102 and at least one asymmetric magnet disposed in the casing 102. The magnet comprises one or more coils operable to generate a magnetic field upon electrification. System 700 includes coils 702, 704, and 606. The one or more coils are positioned asymmetrically in the casing in close proximity to the inner bore 106. In some embodiments, the asymmetrically-shaped array of the plurality of magnetic coils further comprises an elongated shape in which an elongated portion of the elongated shape is furthest from where a patient would be located during operation of the magnetic resonance imaging apparatus. The position of the coils is also known as a configuration, an arrangement and/or an array.

The electromagnetic field of the coils is formed into an asymmetric stray field by an asymmetric position of electromagnetic shields 706 and 708. In particular, shielding 708 retains the stray field close to the second end 414. Yet the first end 408 has reduced, less, or no, shielding. The shielding 708 on the second end 414 and the reduced shielding on the first end 408 yields a stray field that is skewed or elongated in the direction of the first end 408—in the direction of where a patient would be located during operation of the magnetic resonance imaging apparatus. The asymmetric stray field extends further along the negative portion of a longitudinal Z axis 304 than along the positive portion of the longitudinal Z axis 304. This provides a field-of-view (FOV) that is closer to the patient, allowing a patient to more easily place a limb in the FOV for imaging. Thus, system 700 solves the need in the art for more comfortable access to an MRI system by a patient during imaging of an extremity of the patient. This also provides a system with reduced space requirements at the hospital site, with an envelope containing the 5 gauss asymmetric stray field shown in FIG. 8.

In some embodiments, apparatus 700 has a length along the longitudinal Z axis 304 of about 60 centimeters. From the center of the magnetic field of view, the 5 gauss line of the stray field extends about 2.8 meters in the negative direction of the longitudinal Z axis 304, about 1.0 meters in the positive direction of the longitudinal Z axis 304, and about 2.0 meters in either direction from the Z axis along the R axis. The length of the stray field in the negative direction is about 1.8 meters more than the length of the stray field in the positive direction from the center of the field of view. The ratio of the length of the stray field in the negative direction in comparison to the length of the stray field in the positive direction from the center of the field of view is about 2.8. The peak magnetic field in the winding is about 5.5 T, 12,555 cc super I wire is implemented, and the field homogeneity is 5 ppm on 16 centimeters.

While the apparatus 700 is not limited to any particular coil 702, 704 and/or 606 or shields 706 and 708. For sake of clarity, simplified coils 702, 704 and/or 606 and shields 706 and 708 have been described.

Figure 8:
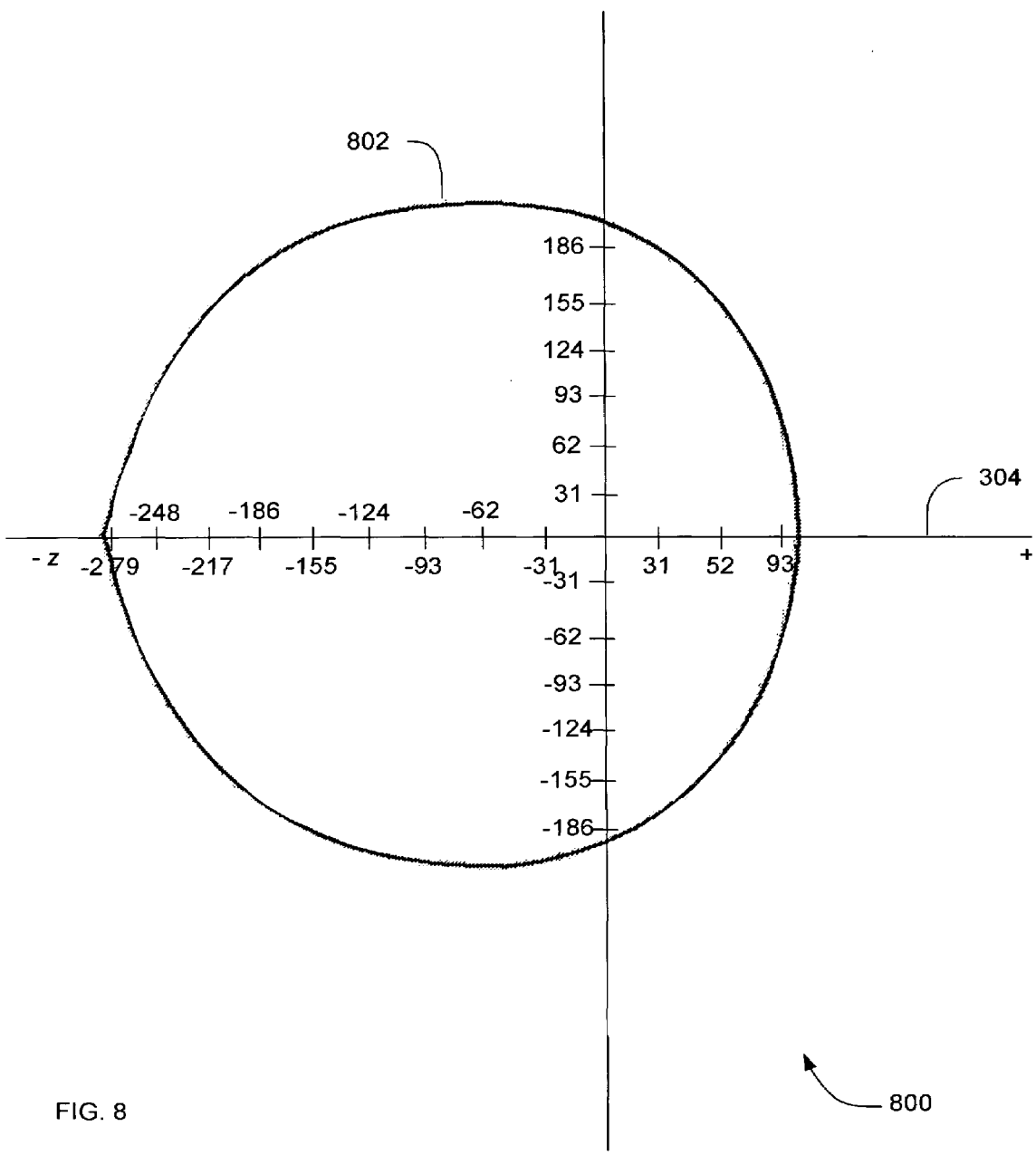
FIG. 8 is a diagram of a stray field according to an embodiment.

FIG. 8 is a diagram of a stray field 800 according to an embodiment. Stray field 800 solves the need in the art for reduced floor space in the hospital for controlling access to the 5 gauss stray field. Stray field 800 is generated by systems 300, 600, 700 and 900, 1000, 1100 and method 1200.

Stray field 800 is asymmetrical and oblong. The outer perimeter 802 defines the 5 gauss line of the stray field 800. The asymmetric stray field 800 extends further along the negative portion of a longitudinal Z axis 304, a space which is required for patient access, than along the positive portion of the longitudinal Z axis 304, a space which is not required for patient access. FIG. 8 shows that the stray field extends from approximately −283 centimeters along the Z axis 304 to approximately 102 centimeters along the Z axis 304. The ellipsoidal 5 gauss line is offset along the Z axis more than the imaging volume is offset in the asymmetric magnet.

Figure 9:
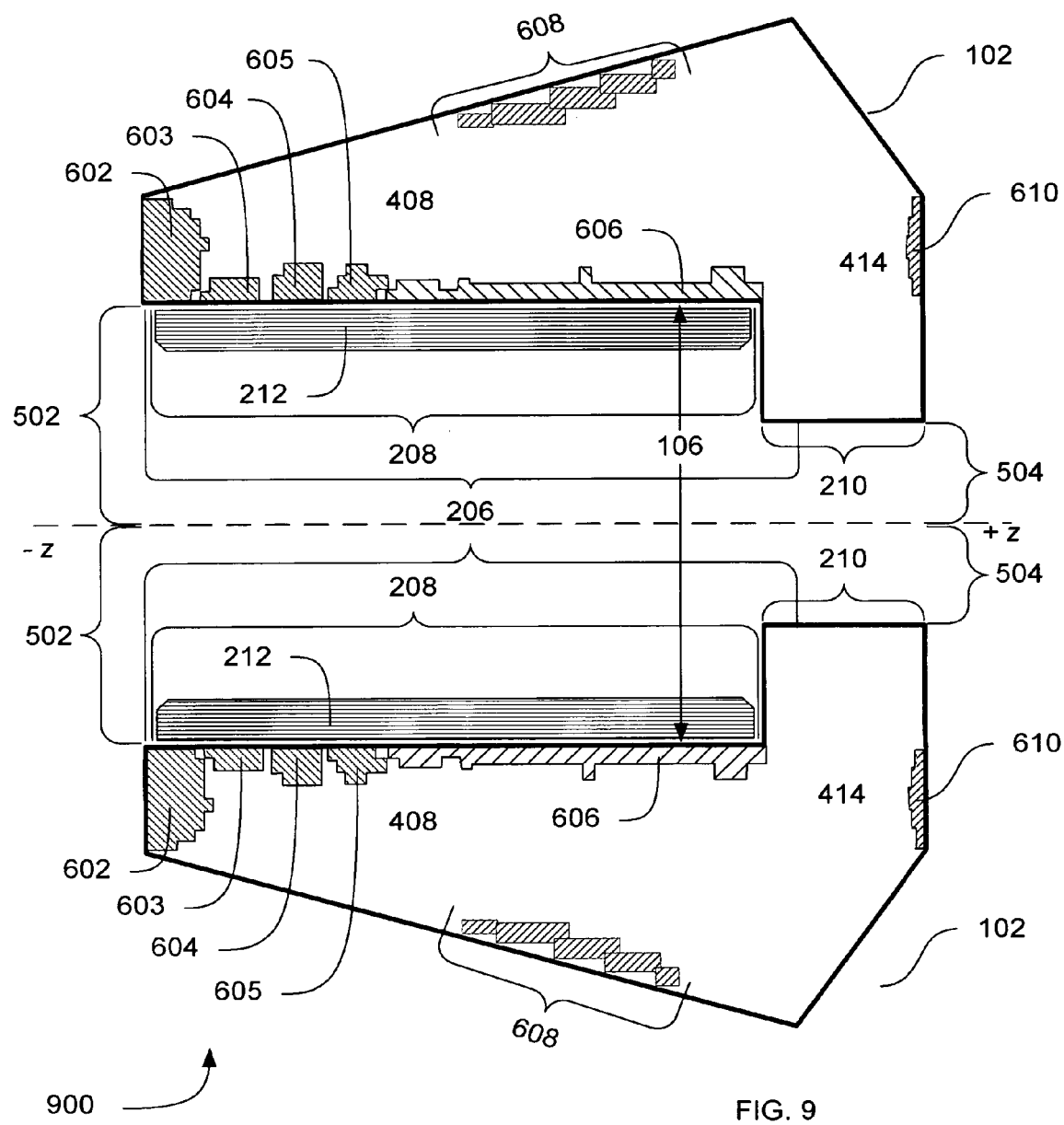
FIG. 9 is a side view cross-sectional block diagram an apparatus having an asymmetric magnet, a stepped radius and a conically-shaped outer perimeter to image a subject.

FIG. 9 is a side view cross-sectional block diagram of an apparatus having an asymmetric magnet, a stepped radius and a conically-shaped outer perimeter to image a subject. System 900 solves the need in the art for more comfortable access to an MRI system by a patient during imaging of an extremity of the patient. Apparatus 900 also solves the need in the art for reduced floor space requirements of MRI systems.

Apparatus 900 includes the features of system 100, 200 and 300 and apparatus 400, 500 and 600 and apparatus 900 also generates stray field 800. The angled outer diameter that is narrower on the side 408 where a patient accesses the interior (inner bore 106) of the apparatus 900 than the larger outer diameter further back on the apparatus improves patient comfort and stray field shielding at the end of the apparatus 900 that is furthest from the patient 414.

Figure 10:
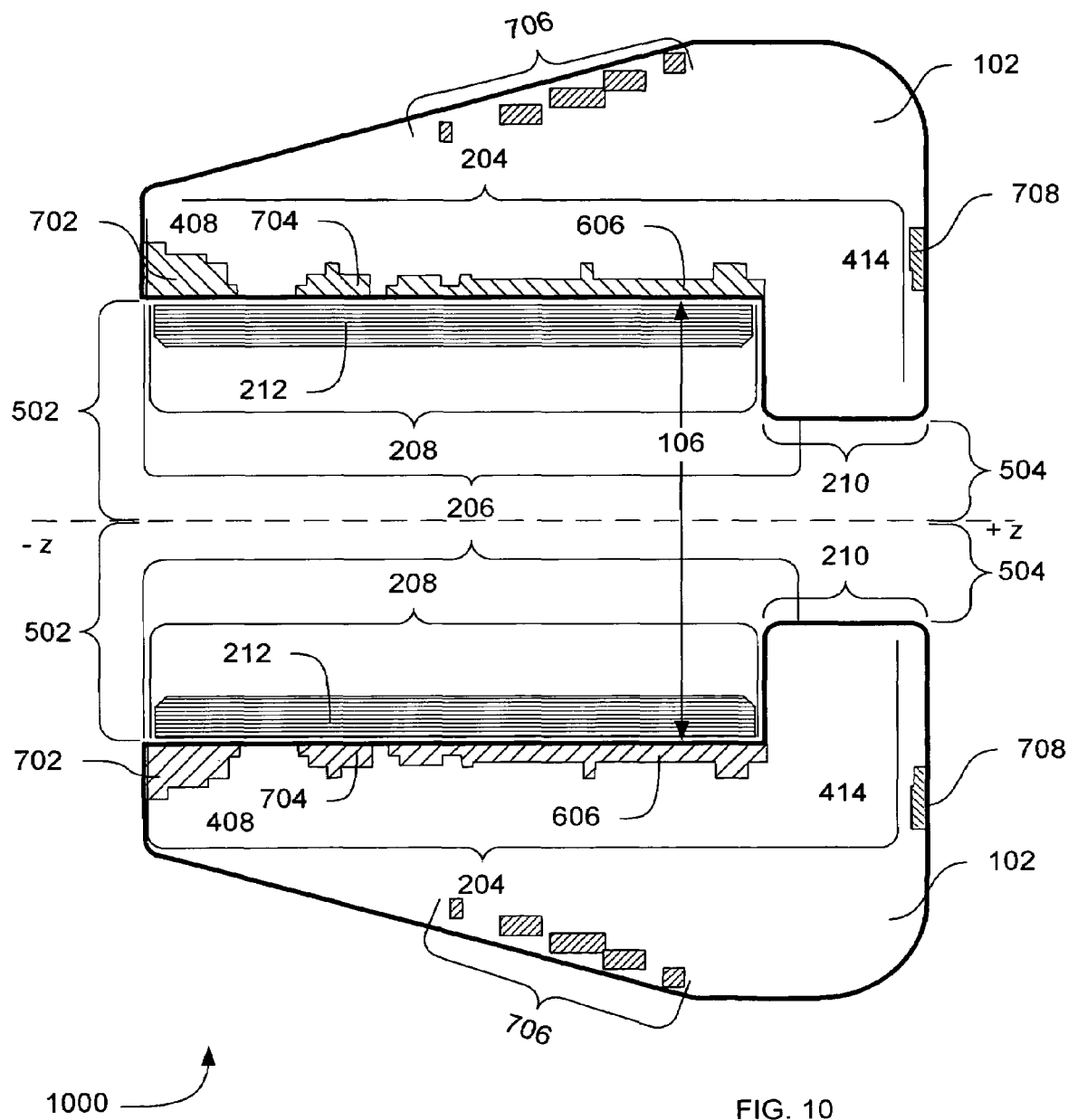
FIG. 10 is a side view cross-sectional block diagram of an apparatus having an asymmetric magnet, a stepped radius and a conically-shaped and rounded outer perimeter to image a subject.

FIG. 10 is a side view cross-sectional block diagram of an apparatus having an asymmetric magnet, a stepped radius and a conically-shaped and rounded outer perimeter to image a subject. System 1000 solves the need in the art for more comfortable access to an MRI system by a patient during imaging of an extremity of the patient. Apparatus 1000 also solves the need in the art for reduced floor space requirements of MRI systems.

Apparatus 1000 includes the features of system 100, 200 and 300 and apparatus 400, 500 and 700, generates stray field 800. The angled outer diameter that is narrower on the side 408 where a patient accesses the interior (inner bore 106) of the apparatus 1000 than the larger outer diameter further back on the apparatus improves patient comfort and stray field shielding at the end of the apparatus 1000 that is furthest from the patient 414.

Some embodiments of apparatus 600, 700, 900 and 100 include a ferromagnetic shield between the coils and the electromagnetic shields.

Figure 11:
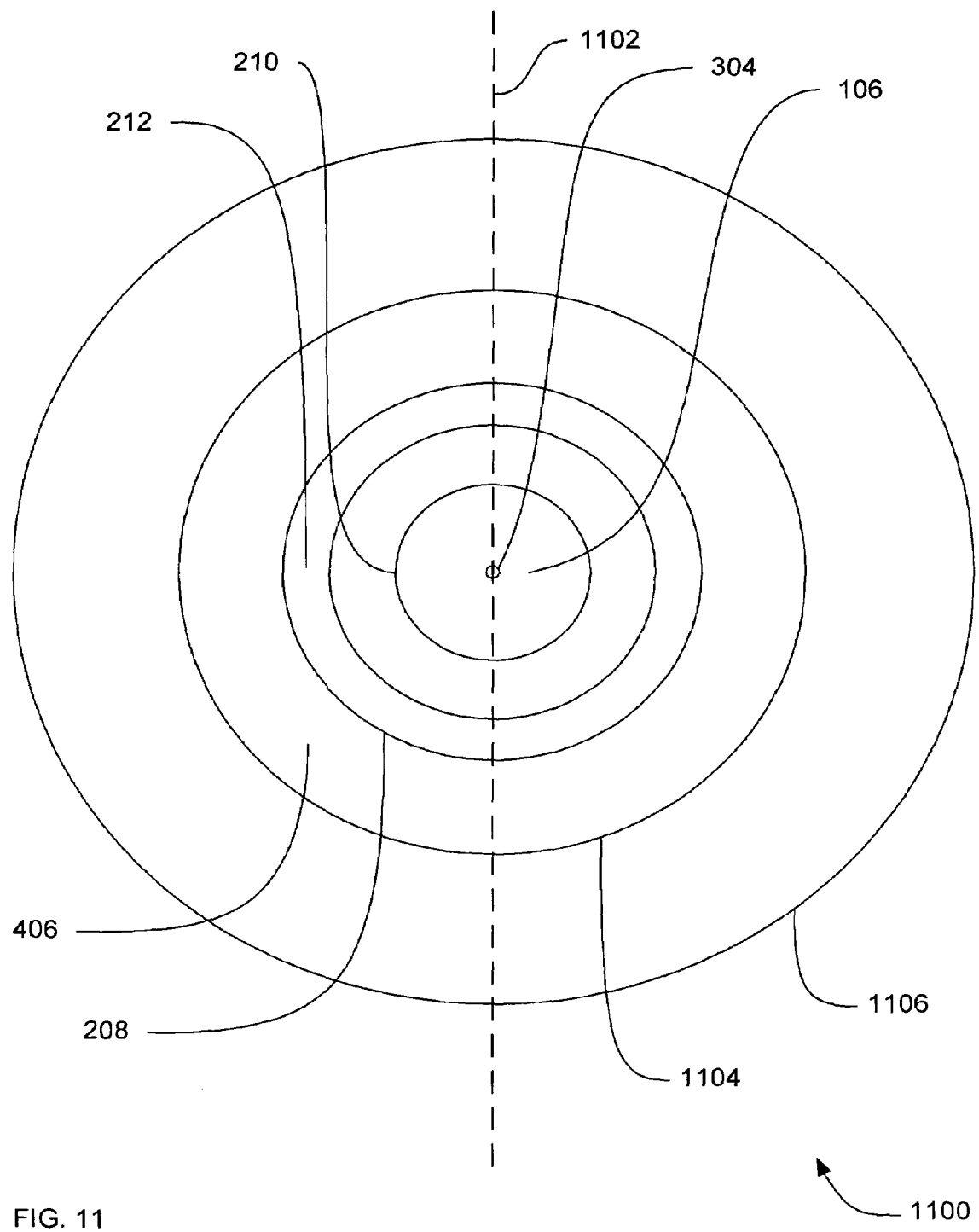
FIG. 11 is a front view cross-sectional block diagram of apparatus in FIGS. 2, 5 and 9.

FIG. 11 is a front view cross-sectional block diagram of apparatus in FIGS. 2, 5 and 9.

FIG. 11 illustrates the longitudinal Z axis 304 in the center of the apparatus in the inner bore 106 that intersects the R axis 1102. The inside perimeter of the second portion 210 of the stepped radius 206 has a narrower diameter than the first portion 208 of the stepped radius 206. The gradient coil 212 extends inward from the first portion 208 of the stepped radius. The front face 406 meets the middle face of the outer perimeter 418 at a joint 1104. The middle face of the outer perimeter 418 meets the back face (not shown) at a joint 1106 which marks the maximum radial dimension of the outer perimeter.

Methods of an Embodiment

In the previous section, apparatus of the operation of an embodiment was described. In this section, the particular methods performed by a processor of a magnetic resonance imaging (MRI) system, of such an embodiment are described by reference to a series of flowcharts.

Figure 12:
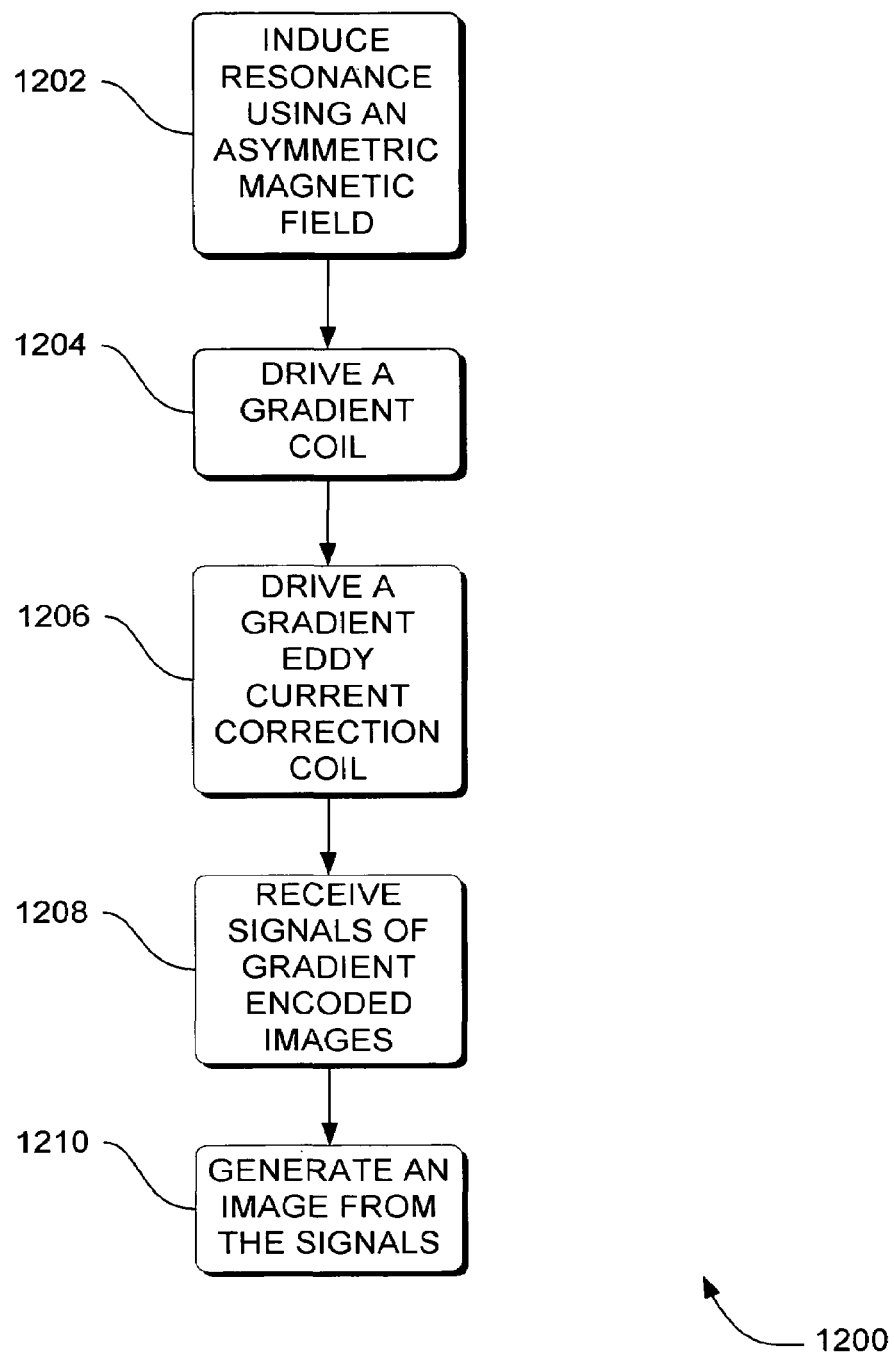
FIG. 12 is a flowchart of a method of generating an image from electromagnetic resonance induced by an asymmetric stray field according to an embodiment.

FIG. 12 is a flowchart of a method 1200 of generating an image from electromagnetic resonance induced by a magnet with an asymmetric stray field according to an embodiment.

Method 1200 includes inducing 1202 electromagnetic resonance in a subject, using an asymmetric magnet that produces an asymmetric stray field. Method 1200 includes driving 1204 a gradient coil to spatially encode the image. Method 1200 also includes driving 1206 a gradient eddy current correction coil in the MRI. The coil compensates for the asymmetric eddy currents generated by the gradient coil in system 200, apparatus 500, 900 and 1000.

Method 1200 further includes receiving 1208 radio frequency signals of gradient encoded images with correction by the gradient eddy current correction coil. Method 1200 also includes generating 1210 an image from the radio frequency signals of gradient encoded images after correcting for asymmetric magnetic eddy currents.

Figure 13:
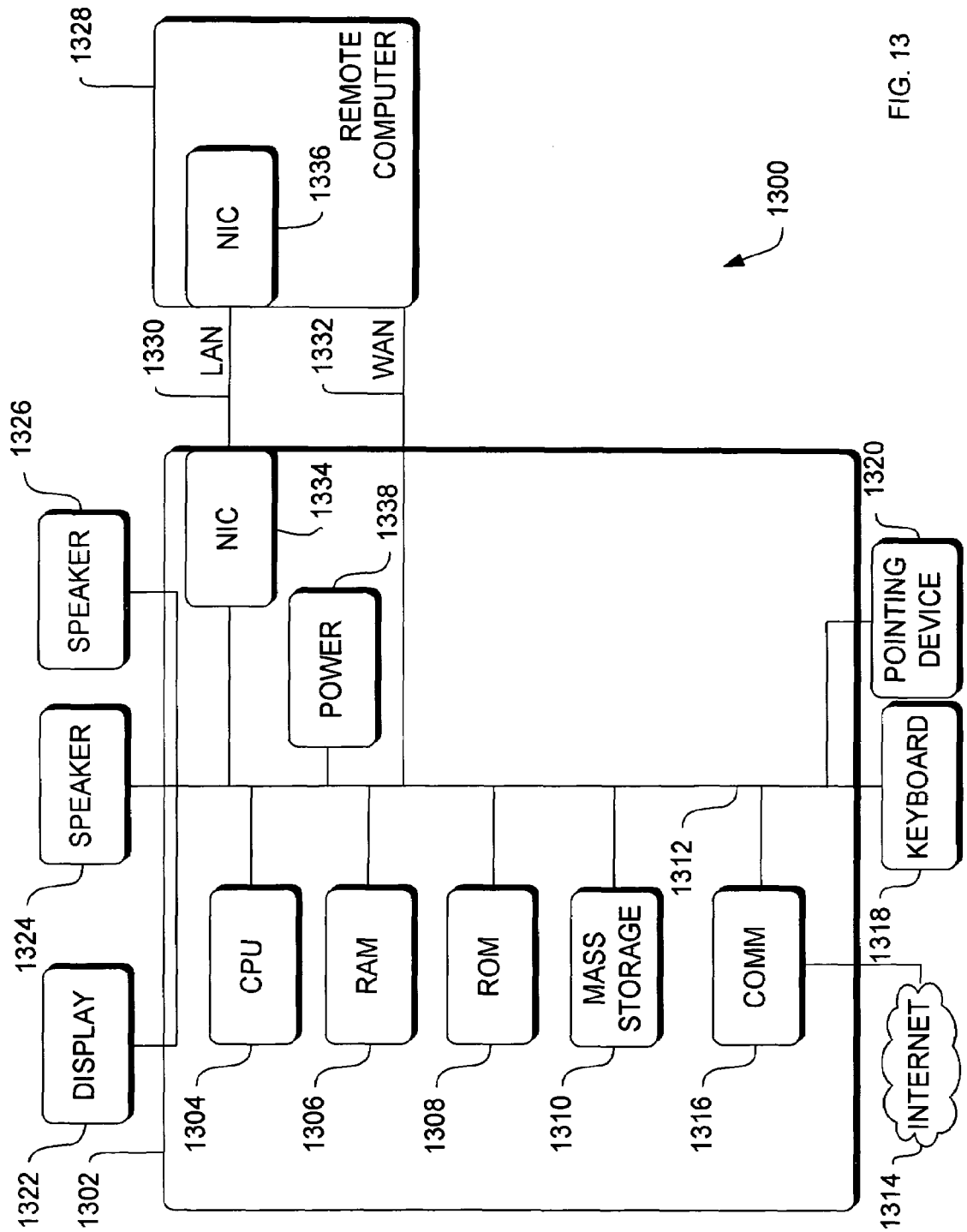
FIG. 13 is a block diagram of the hardware and operating environment in which different embodiments can be practiced.

In some embodiments, method 1200 is implemented as a computer data signal embodied in a carrier wave, that represents a sequence of instructions which, when executed by a processor, such as processor 1304 in FIG. 13, cause the processor to perform the respective method. In other embodiments, method 1200 is implemented as a computer-accessible medium having executable instructions capable of directing a processor, such as processor 1304 in FIG. 13, to perform the respective method. In varying embodiments, the medium is a magnetic medium, an electronic medium, or an optical medium.

Hardware and Operating Environment

FIG. 13 is a block diagram of the hardware and operating environment 1300 in which different embodiments can be practiced. The description of FIG. 13 provides an overview of computer hardware and a suitable computing environment in conjunction with which some embodiments can be implemented. Embodiments are described in terms of a computer executing computer-executable instructions. However, some embodiments can be implemented entirely in computer hardware in which the computer-executable instructions are implemented in read-only memory. Some embodiments can also be implemented in client/server computing environments where remote devices that perform tasks are linked through a communications network. Program modules can be located in both local and remote memory storage devices in a distributed computing environment.

Computer 1302 includes a processor 1304, commercially available from Intel, Motorola, Cyrix and others. Computer 1302 also includes random-access memory (RAM) 1306, read-only memory (ROM) 1308, and one or more mass storage devices 1310, and a system bus 1312, that operatively couples various system components to the processing unit 1304. The memory 1306, 1308, and mass storage devices, 1310, are types of computer-accessible media. Mass storage devices 1310 are more specifically types of nonvolatile computer-accessible media and can include one or more hard disk drives, floppy disk drives, optical disk drives, and tape cartridge drives. The processor 1304 executes computer programs stored on the computer-accessible media.

Computer 1302 can be communicatively connected to the Internet 1314 via a communication device 1316. Internet 1314 connectivity is well known within the art. In one embodiment, a communication device 1316 is a modem that responds to communication drivers to connect to the Internet via what is known in the art as a "dial-up connection." In another embodiment, a communication device 1316 is an Ethernet® or similar hardware network card connected to a local-area network (LAN) that itself is connected to the Internet via what is known in the art as a "direct connection" (e.g., T1 line, etc.).

A user enters commands and information into the computer 1302 through input devices such as a keyboard 1318 or a pointing device 1320. The keyboard 1318 permits entry of textual information into computer 1302, as known within the art, and embodiments are not limited to any particular type of keyboard. Pointing device 1320 permits the control of the screen pointer provided by a graphical user interface (GUI) of operating systems such as versions of Microsoft Windows®. Embodiments are not limited to any particular pointing device 1320. Such pointing devices include mice, touch pads, trackballs, remote controls and point sticks. Other input devices (not shown) can include a microphone, joystick, game pad, satellite dish, scanner, or the like.

In some embodiments, computer 1302 is operatively coupled to a display device 1322. Display device 1322 is connected to the system bus 1312. Display device 1322 permits the display of information, including computer, video and other information, for viewing by a user of the computer. Embodiments are not limited to any particular display device 1322. Such display devices include cathode ray tube (CRT) displays (monitors), as well as flat panel displays such as liquid crystal displays (LCD's). In addition to a monitor, computers typically include other peripheral input/output devices such as printers (not shown). Speakers 1324 and 1326 provide audio output of signals. Speakers 1324 and 1326 are also connected to the system bus 1312.

Computer 1302 also includes an operating system (not shown) that is stored on the computer-accessible media RAM 1306, ROM 1308, and mass storage device 1310, and is and executed by the processor 1304. Examples of operating systems include Microsoft Windows®, Apple MacOS®, Linux®, UNIX®. Examples are not limited to any particular operating system, however, and the construction and use of such operating systems are well known within the art.

Embodiments of computer 1302 are not limited to any type of computer 1302. In varying embodiments, computer 1302 comprises a PC-compatible computer, a MacOS®-compatible computer, a Linux®-compatible computer, or a UNIX®-compatible computer. The construction and operation of such computers are well known within the art.

Computer 1302 can be operated using at least one operating system to provide a graphical user interface (GUI) including a user-controllable pointer. Computer 1302 can have at least one web browser application program executing within at least one operating system, to permit users of computer 1302 to access an intranet, extranet or Internet world-wide-web pages as addressed by Universal Resource Locator (URL) addresses. Examples of browser application programs include Netscape Navigator® and Microsoft Internet Explorer®.

The computer 1302 can operate in a networked environment using logical connections to one or more remote computers, such as remote computer 1328. These logical connections are achieved by a communication device coupled to, or a part of, the computer 1302. Embodiments are not limited to a particular type of communications device. The remote computer 1328 can be another computer, a server, a router, a network PC, a client, a peer device or other common network node. The logical connections depicted in FIG. 13 include a local-area network (LAN) 1330 and a wide-area network (WAN) 1332. Such networking environments are commonplace in offices, enterprise-wide computer networks, intranets, extranets and the Internet.

When used in a LAN-networking environment, the computer 1302 and remote computer 1328 are connected to the local network 1330 through network interfaces or adapters 1334, which is one type of communications device 1316. Remote computer 1328 also includes a network device 1336. When used in a conventional WAN-networking environment, the computer 1302 and remote computer 1328 communicate with a WAN 1332 through modems (not shown). The modem, which can be internal or external, is connected to the system bus 1312. In a networked environment, program modules depicted relative to the computer 1302, or portions thereof, can be stored in the remote computer 1328.

Computer 1302 also includes power supply 1338. Each power supply can be a battery.

CONCLUSION

An improved magnetic resonance imaging system has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations. For example, although described in procedural terms, one of ordinary skill in the art will appreciate that implementations can be made in design methodology or any other methodology that provides the required function.

In particular, one of skill in the art will readily appreciate that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future MRI devices, different magnetic coils, and new magnetic shields.

The terminology used in this application with respect to systems and apparatus is meant to include all MRI environments and alternate technologies which provide the same functionality as described herein.

I claim:

1. A magnetic resonance imaging apparatus to image a subject, the magnetic resonance imaging apparatus comprising:
    a casing having an inner bore;
    a plurality of magnetic main coils positioned in an asymmetrically-shaped array in the casing, the magnetic main coils positioned in close proximity to the inner bore; and
    a plurality of magnetic shield coils positioned in an asymmetrically-shaped array in the casing, radially outward of the main coils,
    wherein the magnetic shield coils further comprises reduced magnetic shield coils at one end,
    wherein the reduced shielding at the one end facilitates an improved patient interface with the magnetic main coils and improved shielding at a second end, and
    wherein an ellipsoidal 5 gauss line of the magnetic main coils is offset along a Z axis more than an imaging volume is offset in the magnetic main coils.

2. The magnetic resonance imaging apparatus of claim 1, wherein the magnetic resonance imaging apparatus further comprises:
    a medical magnetic resonance imaging apparatus.

3. The magnetic resonance imaging apparatus of claim 1, wherein the asymmetrically-shaped array of plurality of magnetic main coils further comprises:
    an elongated shape in which an elongated portion of the elongated shape is farthest from where a patient would be located during operation of the magnetic resonance imaging apparatus.

4. The magnetic resonance imaging apparatus of claim 1, wherein the inner bore has a longitudinal axis;
    wherein the inner bore defines an inner diameter of the case, and
    wherein the casing further comprises a conical outer shape;
    wherein the conically-shaped casing further comprises:
        a front face at a first end of the inner bore, the front face being about perpendicular to the inner diameter, the front face having an front outer radial distance from the inner diameter;

a back face at a second end of the inner bore, the back face being about perpendicular to the inner diameter, the back face having a back outer radial distance from the inner diameter;

a first middle face joining the front face, the first middle face along the outer perimeter of the casing; and a second middle face joining the first middle face and the back face, the second middle face along the outer perimeter of the casing, wherein the first middle face and the second middle face have a middle radial distance from the inner diameter, the radial distance being at the joint between the first middle face and the second middle face, wherein the middle radial distance further comprises a greater distance than the front radial distance, and wherein the middle radial distance further comprises a greater distance than the back radial distance.

5. The magnetic resonance imaging apparatus of claim 4, wherein the front radial distance further comprises a distance of about twenty-five centimeters, and wherein the back radial distance further comprises a distance of about twenty-five centimeters.

6. The magnetic resonance imaging apparatus of claim 4, wherein the inner diameter further comprises a stepped radius, wherein the stepped radius of the inner diameter of the inner bore further comprises:

a first portion of the inner bore having a first radius; and a second portion of the inner bore having a second radius that is unequal to the first radius, wherein the first radius further comprises a distance of about seventeen centimeters, wherein a gradient coil is attached to the first portion; and wherein the second radius further comprises about twelve centimeters.

7. The apparatus of claim 1 further comprising:

a driver of a gradient coil for spatially encoding a magnetic resonance image;

a driver of a gradient eddy current correction coil in a magnetic resonance imaging system; and a receiver of radio frequency signals representing gradient encoded image signals including correction by the gradient eddy current correction coil.

8. The apparatus of claim 1 further comprising:

an inducer of electromagnetic resonance in a subject, using an asymmetric magnet that produces an asymmetric stray field.

9. The apparatus of claim 1, wherein the inner bore defines an inner diameter of the casing and the inner diameter further comprises a stepped radius.

10. The apparatus of claim 9, the stepped radius of the inner diameter of the inner bore further comprises:

a first portion of the inner bore having a first radius; and a second portion of the inner bore having a second radius that is unequal to the first radius.

11. The apparatus of claim 10, wherein the first radius further comprises a distance of about seventeen centimeters, wherein a gradient coil is attached to the first portion; and wherein the second radius further comprises about twelve centimeters.

12. The apparatus of claim 10, wherein the first radius further comprises:

a radius having a distance of about ninety centimeters; and wherein the second radius further comprises:

a radius about sixty-five centimeters.

13. The apparatus of claim 1, wherein the casing further comprises:

a casing having a conical outer shape.

14. The apparatus of claim 1, wherein the casing further comprises:

a casing having a conically-shaped outer perimeter.

15. The apparatus of claim 14, wherein the inner bore defines a longitudinal axis, wherein the inner bore defines an inner diameter of the case, and wherein the conically-shaped outer perimeter is further defined by the casing.

16. The apparatus of claim 15, wherein the casing further comprises:

a front face at a first end of the inner bore, the front face being about perpendicular to the longitudinal axis, the front face having a front outer radial distance from the inner diameter;

a back face at a second end of the inner bore, the back face being about perpendicular to the longitudinal axis, the back face having a back outer radial distance from the inner diameter;

a first middle face joining the front face, the first middle face along the outer perimeter of the casing; and a second middle face joining the first middle face and the back face, the second middle face along the outer perimeter of the casing.

17. The apparatus of claim 16, wherein the first middle face and the second middle face have a middle radial distance from the inner diameter, the radial distance being at the joint between the first middle face and the second middle face.

18. The apparatus of claim 16, wherein the middle radial distance further comprises:

a greater distance than the front radial distance.

19. The apparatus of claim 16, wherein the middle radial distance further comprises:

a greater distance than the back radial distance.

20. The apparatus of claim 16, wherein the front radial distance is about equal to the back radial distance.

* * * * *